United States Patent
Wang et al.

(10) Patent No.: US 10,096,643 B2
(45) Date of Patent: Oct. 9, 2018

(54) FINGERPRINT RECOGNITION CHIP PACKAGING STRUCTURE AND PACKAGING METHOD

(71) Applicant: China Wafer Level CSP Co., Ltd., Suzhou (CN)

(72) Inventors: Zhiqi Wang, Suzhou (CN); Qiong Yu, Suzhou (CN); Wei Wang, Suzhou (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 0 days.

(21) Appl. No.: 15/321,705

(22) PCT Filed: Jun. 30, 2015

(86) PCT No.: PCT/CN2015/082715
§ 371 (c)(1),
(2) Date: Dec. 22, 2016

(87) PCT Pub. No.: WO2016/000597
PCT Pub. Date: Jan. 7, 2016

(65) Prior Publication Data
US 2017/0162620 A1    Jun. 8, 2017

(30) Foreign Application Priority Data

Jul. 1, 2014    (CN) .......................... 2014 1 0310002

(51) Int. Cl.
*H01L 27/146* (2006.01)
*G06K 9/00* (2006.01)
(Continued)

(52) U.S. Cl.
CPC .... *H01L 27/14678* (2013.01); *G06K 9/00053* (2013.01); *G06K 9/00087* (2013.01);
(Continued)

(58) Field of Classification Search
CPC . H01L 27/14618; H01L 21/56; H01L 23/293; H01L 24/48; H01L 24/73;
(Continued)

(56) References Cited

U.S. PATENT DOCUMENTS 6,700,190 B2 * 3/2004 Siegel .................. G06K 9/0002
257/48
6,924,496 B2 * 8/2005 Manansala ......... G06K 9/00053
250/239
(Continued)

FOREIGN PATENT DOCUMENTS

CN    1440060 A    9/2003
CN    1533741 A    10/2004
(Continued)

OTHER PUBLICATIONS

International Search Report for Application No. PCT/CN2015/082715 dated Sep. 18, 2015.
(Continued)

*Primary Examiner* — Manav Seth
(74) *Attorney, Agent, or Firm* — Wolf, Greenfield & Sacks, P.C.

(57) ABSTRACT

A packaging structure and a packaging method for a fingerprint identification chip are provided. The packaging structure includes a substrate, a sensing chip, a wire and a plastic encapsulation layer. The substrate is provided with a first solder pad layer. The sensing chip has a first surface and a second surface opposite to the first surface, the first surface comprises a sensing area and a peripheral area surrounding the sensing area, and the surface of the sensing chip in the peripheral area is provided with a second solder pad layer. Two ends of the wire are electrically connected to the first solder pad layer and the second solder pad layer respectively. The plastic encapsulation layer is made of a polymer,
(Continued)

the plastic encapsulation layer surrounds the wire and the sensing chip.

15 Claims, 4 Drawing Sheets

(51) Int. Cl.
  *H01L 23/29*   (2006.01)
  *H01L 23/00*   (2006.01)
  *H01L 21/56*   (2006.01)

(52) U.S. Cl.
  CPC ............ *H01L 21/56* (2013.01); *H01L 23/293* (2013.01); *H01L 24/48* (2013.01); *H01L 24/73* (2013.01); *H01L 24/92* (2013.01); *H01L 27/14618* (2013.01); *H01L 27/14636* (2013.01); *H01L 2224/48225* (2013.01); *H01L 2224/73265* (2013.01); *H01L 2224/92247* (2013.01)

(58) Field of Classification Search
  CPC ............... H01L 24/92; H01L 27/14636; H01L 27/14678; H01L 2224/48225; H01L 2224/73265; H01L 2224/92247; G06K 9/00053; G06K 9/00087
  See application file for complete search history.

(56) References Cited

U.S. PATENT DOCUMENTS

| | | | | |
|---|---|---|---|---|
| 7,049,166 | B2 * | 5/2006 | Salatino | G06K 9/0002 257/E21.504 |
| 7,109,574 | B2 * | 9/2006 | Chiu | G06K 9/0002 257/684 |
| 7,300,816 | B2 * | 11/2007 | Manansala | G06K 9/00053 257/E21.499 |
| 7,606,400 | B2 * | 10/2009 | Ryhanen | G06K 9/0002 324/661 |
| 7,829,985 | B2 * | 11/2010 | Lee | H01L 21/4846 257/666 |
| 7,872,871 | B2 * | 1/2011 | Hiew | G06F 1/1632 361/730 |
| 8,018,065 | B2 * | 9/2011 | Lam | H01L 21/56 257/620 |
| 9,030,011 | B2 * | 5/2015 | Lin | H01L 21/561 257/738 |
| 9,252,064 | B2 * | 2/2016 | Tsai | H01L 23/041 |
| 9,640,575 | B2 * | 5/2017 | Ryu | H01L 27/14618 |
| 2003/0156743 | A1 | 8/2003 | Okada et al. | |
| 2004/0051155 | A1 | 3/2004 | Oka | |
| 2004/0188838 | A1 | 9/2004 | Okada et al. | |
| 2005/0031174 | A1 * | 2/2005 | Ryhanen | G06K 9/0002 382/124 |
| 2006/0145343 | A1 * | 7/2006 | Lee | H01L 21/4846 257/737 |
| 2009/0283845 | A1 | 11/2009 | Chou | |
| 2010/0237490 | A1 * | 9/2010 | Chu | H01L 21/56 257/692 |
| 2011/0278724 | A1 | 11/2011 | Lin et al. | |
| 2011/0309482 | A1 | 12/2011 | Salatino et al. | |
| 2013/0320532 | A1 | 12/2013 | Lin et al. | |
| 2014/0061841 | A1 * | 3/2014 | Kim | H01L 31/02 257/443 |
| 2014/0140588 | A1 * | 5/2014 | Chou | G06K 9/0002 382/124 |
| 2014/0205161 | A1 | 7/2014 | Salatino et al. | |
| 2014/0264699 | A1 * | 9/2014 | Ryu | H01L 27/14618 257/434 |
| 2014/0328523 | A1 | 11/2014 | Lin et al. | |

FOREIGN PATENT DOCUMENTS

| | | |
|---|---|---|
| CN | 1694260 A | 11/2005 |
| CN | 100555646 C * | 12/2006 |
| CN | 101197382 A | 6/2008 |
| CN | 101482918 A | 7/2009 |
| CN | 102244047 A | 11/2011 |
| CN | 103038782 A | 4/2013 |
| CN | 103793689 A | 5/2014 |
| CN | 104051367 A | 9/2014 |
| CN | 204029787 U | 12/2014 |
| EP | 1343109 A2 | 9/2003 |
| KR | 20130043161 A | 4/2013 |
| TW | 201421021 A | 6/2014 |
| WO | WO 2013/172609 A1 | 11/2013 |

OTHER PUBLICATIONS

Fist Office Action for Application No. TW 104120853 dated Jun. 1, 2016.

PCT/CN2015/082715, Sep. 18, 2015, International Search Report.

Office Communication for Application No. KR 10-2017-7001914 dated Feb. 14, 2018.

* cited by examiner

FINGERPRINT RECOGNITION CHIP PACKAGING STRUCTURE AND PACKAGING METHOD

CROSS-REFERENCE TO RELATED APPLICATIONS

The present application is a National Stage application of PCT international application PCT/CN2015/082715, filed on Jun 30, 2015 which claims priority to Chinese Patent Application No. 201410310002.0, titled "FINGERPRINT RECOGNITION CHIP PACKAGING STRUCTURE AND PACKAGING METHOD", filed on Jul. 1, 2014 with the State Intellectual Property Office of the People's Republic of China, which applications are incorporated herein by reference in their entireties.

FIELD

The present disclosure relates to the technical field of a semiconductor manufacture, and particularly to a packaging structure and a packaging method for a fingerprint identification chip.

BACKGROUND

With a development of a modern world, people gradually pay attention to an importance of a personal identification and a personal information security. Since a human fingerprint has uniqueness and invariance, and a fingerprint identification technology has characteristics of good safety, high reliability, use being easy and convenient, and the fingerprint identification technology is widely used in various fields for protecting a personal information security. With a continuous development of a scientific technology, an information security problem of each kind of an electronic product is always one of focus points to a technical development. Particularly for a mobile terminal, such as a mobile phone, a laptop, a tablet, a digital camera, a requirement of the information security is very prominent.

Figure 1:
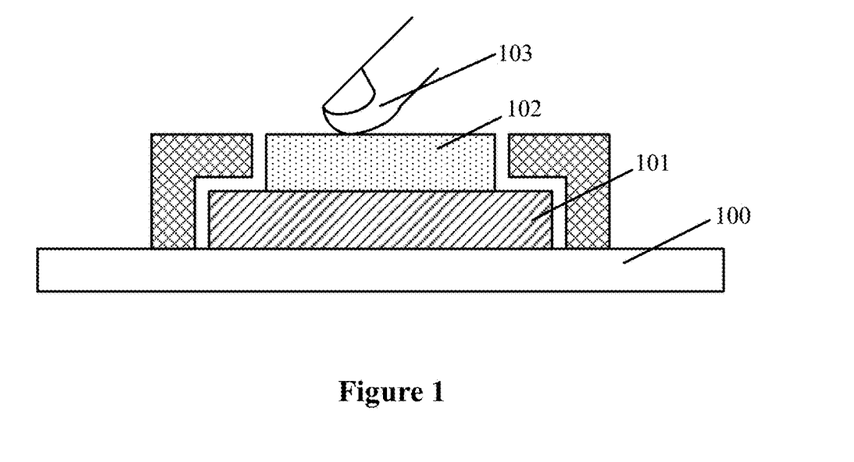
FIG. 1 is a schematic section structural diagram of a fingerprint identification device in a conventional technology.

A sensing method of a conventional fingerprint identification device includes a capacitive method (electric field method) and an inductive method. The fingerprint identification device obtains fingerprint information of a user by extracting a user fingerprint and converting the user fingerprint to an electrical signal and outputting the electrical signal. Specifically, as shown in FIG. 1, FIG. 1 is a schematic section structural diagram of a conventional fingerprint identification device which includes a substrate 100, a fingerprint identification chip 101 coupled to a surface of the substrate 100, and a glass substrate 102 covering a surface of the fingerprint identification chip 101.

A capacitive fingerprint identification chip is taken as an example. There is one or more capacitive plates in the fingerprint identification chip 101. As there are a convex ridge and a concave valley on epidermis or beneath the epidermis of a user finger, when the user finger 103 contacts the surface of the glass substrate 102, a distance from the ridge to the fingerprint identification chip 101 is different from a distance from the valley to the fingerprint identification chip 101. So capacitance between the ridge of the user finger 103 and the capacitive plate is different from capacitance between the valley of the user finger 103 and the capacitive plat. The fingerprint identification chip 101 may obtain the different capacitances and convert the different capacitances to corresponding electrical signals and output the electrical signals. After the received electrical signals are converged, the fingerprint identification device may obtain the fingerprint information of the user.

However, in the conventional fingerprint identification device, a requirement of sensitivity of the fingerprint identification chip is high, which limits a manufacture and an application of the fingerprint identification device.

SUMMARY

A packaging structure and a packaging method for a fingerprint identification chip are provided by the disclosure. The packaging structure can lower a requirement of sensitivity of a sensing chip and lead to a wide application of the sensing chip.

In order to solve the above problem, a packaging structure for a fingerprint identification chip is provided, which includes: a substrate, a sensing chip, a wire and a plastic encapsulation layer. The substrate has a substrate surface, and the substrate surface is provided with a first solder pad layer. The sensing chip is arranged on the substrate surface, where the sensing chip has a first surface and a second surface arranged opposite to the first surface, the second surface of the sensing chip is arranged on the substrate surface, the first surface of the sensing chip includes a sensing area and a peripheral area surrounding the sensing area, and the surface of the sensing chip in the peripheral area is provided with a second solder pad layer. Two ends of the wire are electrically connected to the first solder pad layer and the second solder pad layer respectively, a point of the wire farthest away from the substrate surface is a vertex, and a distance from the vertex to the first surface of the sensing chip is a first distance. The plastic encapsulation layer is arranged on the substrate surface and the first surface of the sensing chip, where the plastic encapsulation layer is made of a polymer, the plastic encapsulation layer surrounds the wire and the sensing chip, a surface of the plastic encapsulation layer on the sensing area is flat, a distance from the surface of the plastic encapsulation layer to the first surface of the sensing chip is a second distance, and the second distance is greater than the first distance.

Optionally, the first distance ranges from 50 micron to 80 micron, and the second distance ranges from 100 micron to 150 micron.

Optionally, a Mohs hardness of the plastic encapsulation layer is greater than or equal to 8H.

Optionally, a dielectric constant of the plastic encapsulation layer ranges from 7 to 9.

Optionally, the plastic encapsulation layer is made of an epoxy resin, a polyimide resin, a benzocyclobutene resin, polybenzoxazole resin, polybutylene terephthalate, a polycarbonate, polyethylene glycol terephthalate, polyethylene, polypropylene, a polyolefin, polyurethane, a polyolefin, a polyethersulfone, a polyamide, a polyurethane, an ethylene vinyl acetate copolymer or a polyvinyl alcohol.

Optionally, the packaging structure further includes a protecting ring arranged on the substrate surface, where the protecting ring surrounds the sensing chip, the wire and the plastic encapsulation layer.

Optionally, the protecting ring is further arranged on the surface of the plastic encapsulation layer, and the plastic encapsulation layer on a surface of the sensing area of the sensing chip is at least exposed from the protecting ring.

Optionally, the packaging structure further includes a groove arranged in the plastic encapsulation layer around the sensing area, where the groove is exposed from a side wall of the plastic encapsulation layer, and part of the protecting ring arranged on the surface of the plastic encapsulation layer is arranged in the groove.

Optionally, a bottom of the protecting ring is fixed on the substrate surface, and the protecting ring is connected to a ground via the substrate.

Optionally, the protecting ring is made of metal.

Optionally, the packaging structure further includes a housing surrounding the plastic encapsulation layer, the wire, the sensing chip and the protecting ring, where the plastic encapsulation layer on a surface of the sensing area is at least exposed from the housing, and a color of the plastic encapsulation layer is the same as a color of the housing.

Optionally, the packaging structure further includes an adhesive layer arranged between the sensing chip and the substrate, where the adhesive layer is configured to fix the sensing chip on the substrate surface.

Optionally, the packaging structure further includes a glass plate arranged on the surface of the plastic encapsulation layer, where the glass plate at least covers the sensing area of the sensing chip.

Optionally, the packaging structure further includes a housing surrounding the plastic encapsulation layer, the wire and the sensing chip, where the plastic encapsulation layer on a surface of the sensing area is exposed from the housing, and a color of the plastic encapsulation layer is the same as a color of the housing.

Optionally, the packaging structure further includes a connecting part arranged at an end of the substrate, where the connecting part is configured to electrically connect the sensing chip with an outside circuit.

Optionally, the substrate is a hard substrate or a soft substrate.

Accordingly, a packaging method for forming any one of the packaging structures for a fingerprint identification chip is provided. The packaging method includes: providing the substrate, where the substrate has a substrate surface, and the substrate surface is provided with a first solder pad layer; fixing the sensing chip on the substrate surface, where the sensing chip has a first surface and a second surface arranged opposite to the first surface, the second surface of the sensing chip is arranged on the substrate surface, the first surface of the sensing chip includes a sensing area and a peripheral area surrounding the sensing area, and the surface of the sensing chip in the peripheral area is provided with a second solder pad layer, the number of the first solder pad layers is the same as the number of the second solder pad layers, a position of the first solder pad layer has a one-to-one correspondence with a position of the second solder pad layer; forming the wire, where two ends of the wire are electrically connected to the first solder pad layer and the second solder pad layer respectively, a point of the wire farthest away from the substrate surface is a vertex, and a distance from the vertex to the first surface of the sensing chip is a first distance; and forming the plastic encapsulation layer on the substrate surface and the first surface of the sensing chip, where the plastic encapsulation layer is made of a polymer, the plastic encapsulation layer surrounds the wire and the sensing chip, a surface of the plastic encapsulation layer on the sensing area is flat, a distance from the surface of the plastic encapsulation layer to the first surface of the sensing chip is a second distance, and the second distance is greater than the first distance.

Optionally, a craftwork for forming the plastic encapsulation layer is an injection molding craftwork, a transfer molding craftwork or a silkscreen craftwork.

Optionally, after the plastic encapsulation layer is formed, a groove is formed in the plastic encapsulation layer around the sensing area, the groove is exposed from a side wall of the plastic encapsulation layer, a protecting ring is formed on the substrate surface around the plastic encapsulation layer, the wire and the sensing chip, part of the protecting ring is arranged on a surface of the plastic encapsulation layer, the plastic encapsulation layer on a surface of the sensing area of the sensing chip is at least exposed from the protecting ring, and the part of the protecting ring arranged on the surface of the plastic encapsulation layer is arranged in the groove.

Compared with the conventional technology, the technical solutions of the disclosure have the following advantages.

In the packaging structure of the disclosure, the second surface of the sensing chip is arranged on the substrate surface, the first surface of the sensing chip has the sensing area configured to extract a user fingerprint. The plastic encapsulation layer arranged on the substrate surface and the first surface of the sensing chip covers a surface of the sensing area of the sensing chip, the plastic encapsulation layer is configured to protect the sensing area. When a finger of a user is placed on the surface of the plastic encapsulation layer on the sensing area, the user fingerprint may be extracted in the sensing area. The sensing chip may convert the user fingerprint to an electrical signal to output. Since the plastic encapsulation layer is made of the polymer, the polymer has a good ductility and flexibility and a good covering function, the plastic encapsulation layer is thin and hardness of the plastic encapsulation layer is high, and the plastic encapsulation layer has enough hardness to protect the sensing chip. Moreover, a distance from the surface of the plastic encapsulation layer to the sensing chip is reduced, the sensing chip can easily detect the user fingerprint. Accordingly, the packaging structure may reduce a requirement of a sensitivity of the sensing chip, which leads to a wide application of the packaging structure for the fingerprint identification chip.

Secondly, the plastic encapsulation layer is made of the polymer. Adopting the plastic encapsulation layer to protect the sensing area may reduce a manufacture cost of the packaging structure. And, the plastic encapsulation layer is further arranged on a surface of the substrate and the sensing chip besides the sensing area to package the sensing chip and fix the sensing chip on the substrate surface. The packaging structure for the fingerprint identification chip is simple.

Thirdly, the substrate surface is provided with the first solder pad layer. The first surface of the sensing chip is provided with the second solder pad layer. And the second solder pad layer has a one-to-one correspondence with the first solder pad layer. The two ends of the wire are electrically connected to the first solder pad layer and the second solder pad layer respectively to couple the sensing chip and the substrate. Since the second solder pad layer is arranged on the first surface of the sensing chip, the packaging structure is simple, the manufacture cost of the packaging structure is low. And there is the first distance from the vertex of the wire to the first surface of the sensing chip, and there is the second distance from the surface of the plastic encapsulation layer to the first surface of the sensing chip, and the second distance is greater than the first distance. So, the plastic encapsulation layer completely surrounds the wire to protect the wire and electrically isolate the wire from an outside.

Furthermore, the first distance ranges from 50 micron to 80 micron. The first distance is a distance from the vertex of the wire to the first surface of the sensing chip. In a case that the distance from the vertex to the surface of the sensing chip ranges from 50 micron to 80 micron, a good electrical connectivity between the first solder pad layer and the second solder pad layer is ensured and the plastic encapsulation layer may fully electrically isolate the wire and the sensing chip to prevent a short circuit. The second distance ranges from 100 micron to 150 micron. The second distance is a distance from the surface of the plastic encapsulation layer to the surface of the sensing chip. In a case that the distance from the surface of the plastic encapsulation layer to the surface of the sensing chip ranges from 100 micron to 150 micron, the plastic encapsulation layer may fully cover and surround the wire to completely electrically isolate the wire from an outside. And the second distance is a distance from the surface of the plastic encapsulation layer to the sensing area of the sensing chip, so the plastic encapsulation layer on the surface of the sensing area is thin, and the user fingerprint contacting the surface of the plastic encapsulation layer may be easily detected in the sensing area and the requirement of the sensitivity of the sensing chip is reduced.

Furthermore, the Mohs hardness of the plastic encapsulation layer is greater than or equal to 8 H. The hardness of the plastic encapsulation layer is high. Even though the plastic encapsulation layer on the surface of the sensing area is thin, the plastic encapsulation layer still has the enough hardness to protect the sensing area. When the user finger is placed on the surface of the plastic encapsulation layer on the sensing area, the plastic encapsulation layer is not easy to distort and wear down, so the extracting result of the user fingerprint is more accurate.

Furthermore, the dielectric constant of the plastic encapsulation layer ranges from 7 to 9. The dielectric constant of the plastic encapsulation layer is large, the electrical isolation performance of the plastic encapsulation layer is better and a protection ability of the plastic encapsulation layer to the sensing area is better. Although the plastic encapsulation layer on the surface of the sensing area is thin, electrical isolation ability between the user finger and the sensing area is strong. A capacitance generated between the user finger and the sensing area is great, and the capacitance is in a range that may be detected.

Furthermore, the substrate surface is provided with the protecting ring. The protecting ring surrounds the sensing chip, the wire and the plastic encapsulation layer. The protecting ring is configured to perform static protection on the sensing chip and avoid decrease in an accuracy of the user fingerprint data detected in the sensing area. The protecting ring further may eliminate a signal noise outputted by the sensing chip, and data detected by the sensing chip and a signal outputted by the sensing chip is more accurate.

In the packaging method of the disclosure, the first surface of the sensing chip has the sensing area. The plastic encapsulation layer formed on the substrate and the surface of the sensing chip further covers the surface of the sensing area. The plastic encapsulation layer may package the sensing chip and protect the sensing area of the sensing chip. When the user finger is placed on the surface of the plastic encapsulation layer on the sensing area, the fingerprint may be detected. Since the plastic encapsulation layer is made of the polymer, the polymer has a good ductility and flexibility and a good covering function, the plastic encapsulation layer on the surface of the sensing area is thin and hardness of the plastic encapsulation layer is high, the plastic encapsulation layer has enough hardness to protect the sensing chip. In addition, a distance from the surface of the plastic encapsulation layer to the sensing chip is reduced, the user fingerprint data may be easily detected in the sensing area. The formed packaging structure may reduce a requirement of a sensitivity of the sensing chip. An application field of the packaging method is wide. In addition, since the plastic encapsulation layer may package the sensing chip and protect the sensing area, and the method for packaging the sensing chip is simplified. The plastic encapsulation layer is made of the polymer, a cost for forming the plastic encapsulation layer is low, which reduces the cost of the packaging craftwork.

DETAILED DESCRIPTION OF THE EMBODIMENTS

As described in the background, in the conventional fingerprint identification device, the requirement of the sensitivity of the fingerprint identification chip is high, and the manufacture and the application of the fingerprint identification device is limited.

It can be seen from a study that, referring to FIG. 1, a surface of a fingerprint identification chip 101 is covered by a glass substrate 102 configured to protect the fingerprint identification chip 101. A user finger 103 directly contacts the glass substrate 102. In order to ensure that the glass substrate 102 has enough protection ability, the glass substrate 102 is thick. However, as the glass substrate 102 is thick, the fingerprint identification chip 101 is required to have a high sensitivity to accurately extract a user fingerprint. However, a manufacture of a fingerprint identification chip with high sensitivity is difficult and the manufacture cost is high, which limits an application and a marketing of the fingerprint identification chip.

Particularly, continuing taking the capacitive fingerprint identification device as an example, when the user finger 103 is placed on a surface of the glass substrate 102, a capacitor is generated between a capacitive plate of the fingerprint identification chip 101 and the user finger 103. The user finger 103 and the capacitive plate are the two poles of the capacitor. The glass substrate 102 is a dielectric between the two poles of the capacitor. However, as the glass substrate 102 is thick, a capacitance between the user finger 103 and the capacitive plate is great. However a height difference between a ridge and a valley of the user finger 103 is small, a difference between a capacitance between the ridge and the capacitive plate and a capacitance between the valley and the capacitive plate is very small. In order to accurately detect the difference of the capacitance, the fingerprint identification chip 101 is required to have a high sensitivity.

In order to solve the above problem, the disclosure provides a packaging structure and a packaging method for a fingerprint identification chip. In the packaging structure, a sensing area of a sensing chip is covered by a plastic encapsulation layer. The plastic encapsulation layer on a surface of the sensing area replaces a conventional glass substrate and may directly contact a user finger and is configured to protect the sensing chip. As the plastic encapsulation layer is made of a polymer. The polymer has a good ductility and flexibility, the plastic encapsulation layer is thick and hardness of the plastic encapsulation layer is high. A distance from a surface of the plastic encapsulation layer to the sensing chip is reduced in a case that the plastic encapsulation layer may protect the sensing chip, the sensing chip can easily detect a user fingerprint. Correspondingly, the packaging structure reduces a requirement of sensitivity of the sensing chip and leads to a wide application of the packaging structure for the fingerprint identification chip.

In order to make an objective, a characteristic and an advantage of the disclosure more apparent and easy to be understood, hereinafter particular embodiments of the disclosure are specifically illustrated in conjunction with the drawings.

FIG. 2 to FIG. 7 each is a schematic diagrams of a packaging structure for a fingerprint identification chip according to an embodiment of the disclosure.

Figure 2:
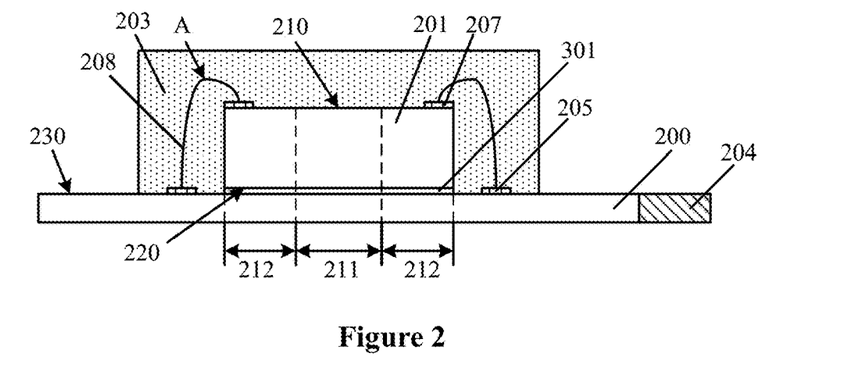
FIG. 2 is a schematic diagram of a packaging structure for a fingerprint identification chip according to a preferred embodiment of the disclosure.

Referring to FIG. 2, the packaging structure for a fingerprint identification chip includes a substrate 200, a sensing chip 201, a wire 208 and a plastic encapsulation layer 203. The substrate 200 has a substrate surface 230, and the substrate surface 230 of the substrate 200 is provided with a first solder pad layer 205. The sensing chip 201 is arranged on the substrate surface 230 of the substrate 200, where the sensing chip 201 has a first surface 210 and a second surface 220 arranged opposite to the first surface 210, the second surface 220 of the sensing chip 201 is arranged on the substrate surface 230 of the substrate 200, the first surface 210 of the sensing chip 201 includes a sensing area 211 and a peripheral area 212 surrounding the sensing area 211, and the surface of the sensing chip 201 in the peripheral area 212 is provided with a second solder pad layer 207. The number of the first solder pad layers 205 is the same as the number of the second solder pad layers 207, a position of the first solder pad layer 205 has a one-to-one correspondence with a position of the second solder pad layer 207. Two ends of the wire 208 are electrically connected to the first solder pad layer 205 and the second solder pad layer 207 respectively, a point of the wire 208 farthest away from the substrate surface 230 of the substrate 200 is a vertex A, and a distance from the vertex to the first surface 210 of the sensing chip is a first distance. The plastic encapsulation layer 203 is arranged on the substrate surface 230 of the substrate 200 and the first surface 210 of the sensing chip 201, where the plastic encapsulation layer 203 is made of a polymer, the plastic encapsulation layer 203 surrounds the wire 208 and the sensing chip 201, a surface of the plastic encapsulation layer 203 on the sensing area 201 is flat, a distance from the surface of the plastic encapsulation layer 203 to the first surface 210 of the sensing chip 201 is a second distance, and the second distance is greater than the first distance.

Hereinafter the packaging structure for the fingerprint identification chip is described in detail.

The substrate 200 is configured to fix the sensing chip 201 and electrically connect the sensing chip 201 to other components or circuits. The substrate 200 is a hard substrate or a soft substrate, which may arrange the components of the sensing chip 201 or adjust a terminal according to a requirement. In the embodiment, the substrate 200 is the hard substrate. The hard substrate is a PCB substrate, a glass substrate, a metal substrate, a semiconductor substrate or a polymer substrate.

The substrate 200 has the substrate surface 230, and the sensing chip 201 is coupled to the substrate surface 230 of the substrate 200. The substrate surface 230 of the substrate 200 is provided with a routing layer (not shown). The routing layer is connected to a second connecting end 205 on the substrate surface 230 of the substrate 200. The second connecting end 205 is connected to a chip circuit on a surface of the sensing chip 201.

In the embodiment, a connecting part 204 is arranged at one end of the substrate 200. The connecting part 204 is configured to electrically connect the sensing chip 201 to an outside circuit. The connecting part 204 may be made of conductive material. The connecting part 204 is electrically connected to the routing layer, and the chip circuit is electrically connected to the outside circuit or component via the routing layer of the substrate surface 230 of the substrate 200 and the connecting part 204 and to transmit of an electrical signal.

The sensing area 211 on the first surface 210 of the sensing chip 201 is configured to detect and receive fingerprint information of a user. The sensing area 211 may has a capacitive structure or a inductive structure. The capacitive structure or the inductive structure may be used to obtain the fingerprint information of the user.

As the first solder pad layer 205 is connected to the second solder pad layer 207 via the wire 208, there is an adhesive layer 301 between the sensing chip 201 and the substrate 200, the adhesive layer 301 is configured to fix the sensing chip 201 on the substrate surface 230 of the substrate 200.

In the embodiment, the sensing area 211 has at least one capacitive plate. When the user finger is placed on a surface of the plastic encapsulation layer 203 on the sensing area 211, a capacitive structure is formed by the capacitive plate, the plastic encapsulation layer 203 and the user finger. The sensing area 211 may obtain a capacitance difference between a capacitance between a ridge on a surface of the user finger and the capacitive plate and a capacitance between a valley on a surface of the user finger and the capacitive plate, and process the capacitance difference via the chip circuit then output the processed capacitance difference, to obtain data of the user fingerprint.

The first surface 210 of the sensing chip 201 further includes a peripheral area 212 surrounding the sensing area 211. The peripheral area 212 of the first surface 210 of the sensing chip 201 has a chip circuit (not shown). The chip circuit is electrically connected to the capacitive structure or the inductive structure in the sensing area 211, the chip circuit is used to process an electrical signal outputted by the capacitive structure or the inductive structure.

A surface of the peripheral area 212 of the sensing chip 201 further has the second solder pad layer 207. The second solder pad layer 207 is electrically connected to the first solder pad layer 205 on the substrate surface of the substrate 200. Moreover, the chip circuit is connected to the first connecting end 207 so to implement an electrical connection between the sensing area 211 of the sensing chip 201 and the substrate 200, and implement a transmission of an electrical signal to an outside circuit via the routing layer on the substrate surface and the connecting part 204.

The second solder pad layer 207 is arranged on the first surface 210 of the sensing chip 201. The second solder pad layer 207 is connected to the first solder pad layer 205 via the wire 208. Before the sensing chip 201 is fixed to the substrate surface of the substrate 200, there is no need to change a structure of the sensing chip 201. An electrical connection between the sensing chip 201 and the substrate 200 can be implemented. So the packaging structure is simple and a manufacture cost is low.

Since the second solder pad layer 207 is arranged in the peripheral area 212 of the sensing chip 201 and the peripheral area 212 surrounds the sensing area 211, the second solder pad layer 207 is arranged in a region near a margin of the sensing chip 201. A proportion of an effective area (the area having the sensing area 211 and the chip circuit) in a center of the sensing chip 201 occupied by the second solder pad layer 207 and the wire 208 connected to the second solder pad layer 207 is small, which improves a chip space utilization ratio of the sensing chip 201, and lower the manufacture cost of the packaging structure. In addition, since the second solder pad layer 207 and the wires 208 are arranged in a region near a margin of the sensing chip 201, a size of an opening of the sensing area 211 exposed from a housing 400 (shown in FIG. 3) or a protecting ring 209 (shown in FIG. 4) surrounding the sensing chip 201 may be adjusted according to a technical requirement. Even though the opening is large, it does not make an effect on accuracy of detecting the user fingerprint by the sensing area 211.

The two ends of the wire 208 are connected to the first solder pad layer 205 and the second solder pad layer 207 respectively, the chip circuit is electrically connected to the routing layer of the surface of the substrate 200. The routing layer is electrically connected to the connecting part 204, and the chip circuit on the surface of the sensing chip 201 and the sensing area 211 transmit an electrical signal to the outside circuit or components. The wire 208 is made of metal, and the metal is copper, tungsten, aluminum, gold or silver.

The wire 208 is connected between the first solder pad layer 205 and the second solder pad layer 207, so the wire 208 curves. The wire 208 has a vertex A which is the farthest away from the substrate surface of the substrate 200. And the vertex A is higher than the first surface 210 of the sensing chip 201, so that the plastic encapsulation layer 203 completely surrounds the wire 208 and electrically isolate the wire 208 from the sensing chip 201. In the embodiment, a distance from the first solder pad layer 205 to the second solder pad layer 207, a thickness of the sensing chip 201 and the first distance from the vertex A to the first surface 210 of the sensing chip 201 ranges from 50 micron to 80 micron.

In order to make the plastic encapsulation layer 203 completely surround the wire 208 and make the wire do not have a surface exposed to an outside, the second distance from the surface of the plastic encapsulation layer 203 to the first surface 210 of the sensing chip 201 is greater than the first distance. In the embodiment, the second distance ranges from 100 micron to 150 micron.

The plastic encapsulation layer 203 is arranged on the substrate surface of the substrate 200 and surrounds the sensing chip 201 and the wire 208 and is configured to fix the sensing chip 201 on the substrate surface of the substrate 200 and protect the sensing chip 201 and the wire 208 and make the sensing chip 201 and the wire 208 be electrically isolated from the outside.

The plastic encapsulation layer 203 is further arranged on a surface of the sensing area 211 of the sensing chip 201, so that the plastic encapsulation layer 203 can protect the sensing area 211. The user finger may directly contact the plastic encapsulation layer 203 on the surface of the sensing area 211. Since the plastic encapsulation layer 203 may protect and fix the sensing chip 201 and protect the sensing area 211 of the sensing chip 201 and may directly contact the user finger, the packaging structure for the fingerprint identification chip in the embodiment is simple, which may reduce the manufacture cost.

The plastic encapsulation layer 203 is made of the polymer. The polymer has a good ductility and flexibility and a good covering function, the plastic encapsulation layer 203 on the surface of the sensing area 211 is thin, so as to enhance a sensing ability of the sensing chip 201 to the user finger fingerprint. In addition, by selecting and adjusting a kind of the polymer, the plastic encapsulation layer 203 on the surface of the sensing area 211 may have a high hardness, thereby ensuring an enough protection ability of the plastic encapsulation layer 203 to the sensing chip 211.

The thickness of the plastic encapsulation layer 203 on the surface of the sensing area 211 ranges from 100 micron to 150 micron. The thickness is thin. When the user finger is placed on the surface of the plastic encapsulation layer 203 on the sensing area 211, a distance from the user finger to the sensing area 211 is small, so the sensing area 211 can easily detect the fingerprint of the user finger and a requirement of a high sensitivity of the sensing chip 201 is lowered.

In the embodiment, the sensing area 211 has a capacitive plate. Since the plastic encapsulation layer 203 on the surface of the sensing area 211 is thin, when the user finger is placed on the surface of the plastic encapsulation layer 203 on the sensing area 211, a distance from the user finger to the capacitive plate is short, so a capacitance between the user finger and the capacitive plate is small. Correspondingly, a capacitance difference between a capacitance between a ridge (convex) on a surface of the user finger and the capacitive plate and a capacitance between a valley (concave) on a surface of the user finger and the capacitive plate is great, therefore the sensing area 211 is easy to detect fingerprint information of the user finger.

The Mohs hardness of the plastic encapsulation layer 203 is greater than or equal to 8 H. The hardness of the plastic encapsulation layer 203 is high. Even though the plastic encapsulation layer 203 on the surface of the sensing area 211 is thin, the plastic encapsulation layer 203 still can protect the sensing area 211 of the sensing chip 201. When the user finger moves on the surface of the plastic encapsulation layer 203 on the sensing area 211, the sensing chip 201 may not be damaged. And since the hardness of the plastic encapsulation layer 203 is high, it is hard for the plastic encapsulation layer 203 to be distorted. Even though the user finger presses the surface of the plastic encapsulation layer 203, it is hard for the thickness of the plastic encapsulation layer 203 to be change, thereby ensuring the detecting result accuracy of the sensing area 211.

The dielectric constant of the plastic encapsulation layer 203 ranges from 7 to 9. The electrical isolation ability of the plastic encapsulation layer 203 is strong. The protection ability of the plastic encapsulation layer 203 on the surface of the sensing area 211 for the sensing area 211 is strong.

In the embodiment, the plastic encapsulation layer 203 on the surface of the sensing area 211 is thin. The capacitance between the user finger and the capacitive plate is inversely proportional to the thickness of the plastic encapsulation layer 203 and is proportional to the dielectric constant of the plastic encapsulation layer 203. In a case that the plastic encapsulation layer 203 on the surface of the sensing area 211 is thin and the dielectric constant of the plastic encapsulation layer 203 is large, the capacitance between the user finger and the capacitive plate is in a range can be detected by the sensing area 211, which prevents the sensing area 211 from sensing failure caused by an over large or over small capacitance.

The thickness of the plastic encapsulation layer 203 on the surface of the sensing area 211 ranges from 20 micron to 100 micron. The dielectric constant is greater than or equal to 7. The larger the dielectric constant of the plastic encapsulation layer 203 is, the larger the thickness of the plastic encapsulation layer 203 on the surface of the sensing area 211, and the capacitance between the user finger and the capacitive plate is in a stable range can be detected in the sensing area 211.

The plastic encapsulation layer 203 is made of an epoxy resin, a polyimide resin, a benzocyclobutene resin, polybenzoxazole resin, polybutylene terephthalate, a polycarbonate, polyethylene glycol terephthalate, polyethylene, polypropylene, a polyolefin, polyurethane, a polyolefin, a polyethersulfone, a polyamide, a polyurethane, an ethylene vinyl acetate copolymer, a polyvinyl alcohol or other suitable polymer.

Figure 3:
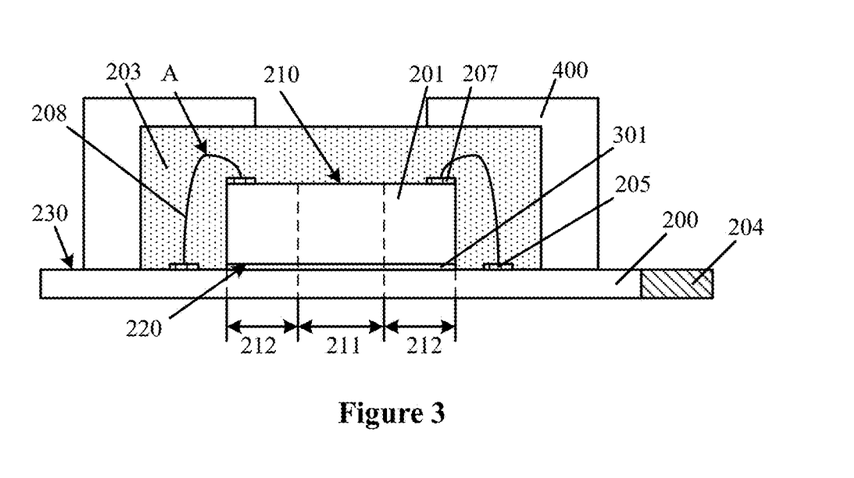
FIG. 3 is a schematic diagram of a packaging structure for a fingerprint identification chip according to a preferred embodiment of the disclosure.

In one embodiment, referring to FIG. 3, the packaging structure further includes: a housing 400 surrounding the plastic encapsulation layer 203, the wire 208 and the sensing chip 201, where the plastic encapsulation layer 203 on a surface of the sensing area 211 is exposed from the housing 400, and a color of the plastic encapsulation layer 203 is the same as a color of the housing 400. For example, in a case that the color of the housing 400 is black, the color of the plastic encapsulation layer 203 is black. In a case that the color of the housing 400 is white, the color of the plastic encapsulation layer 203 is white. In this way, the whole packaging structure for the fingerprint identification chip is aesthetic and coordinating.

Figure 4:
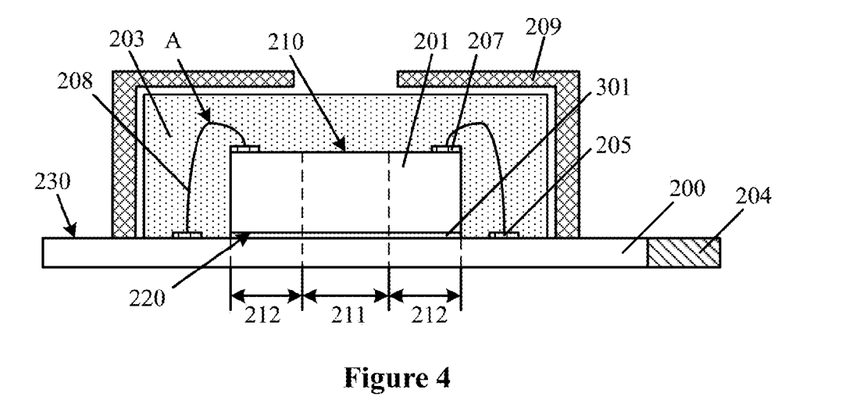
FIG. 4 is a schematic diagram of a packaging structure for a fingerprint identification chip according to a preferred embodiment of the disclosure.

In one embodiment, referring to FIG. 4, the packaging structure further includes a protecting ring 209 arranged on the surface of the substrate 200. The protecting ring 209 surrounds the sensing chip 201, the wire 208 and the plastic encapsulation layer 203. A bottom of the protecting ring 209 is fixed on the substrate surface 230 of the substrate 200. The protecting ring 209 is connected to a ground via the substrate 200.

In the embodiment, the protecting ring 209 is further arranged on the surface of the plastic encapsulation layer 203 and the plastic encapsulation layer 203 on the surface of the sensing area 211 of the sensing chip 201 is at least exposed from the protecting ring 209. In other embodiments, the protecting ring is only arranged around the sensing chip 201, the wire 208 and the plastic encapsulation layer 203 and the surface of the plastic encapsulation layer 203 is exposed from the protecting ring.

The protecting ring 209 is made of metal. The metal is copper, tungsten, aluminum, silver or gold. The protecting ring 209 is configured to perform static protection on the sensing chip 201. Since the protecting ring 209 is made of metal, the protecting ring 209 may conduct electricity. Static is generated when the user finger contacts the plastic encapsulation layer 203. The static charge is firstly transmitted from the protecting ring 209 to the substrate 200, so as to prevent the plastic encapsulation layer 203 from being broken down by an over large static voltage and so as to protect the sensing chip 201, improve the accuracy of the fingerprint detection, eliminate a signal noise outputted by the sensing chip 201 and a signal outputted by the sensing chip 201 is more accurate.

Figure 5:
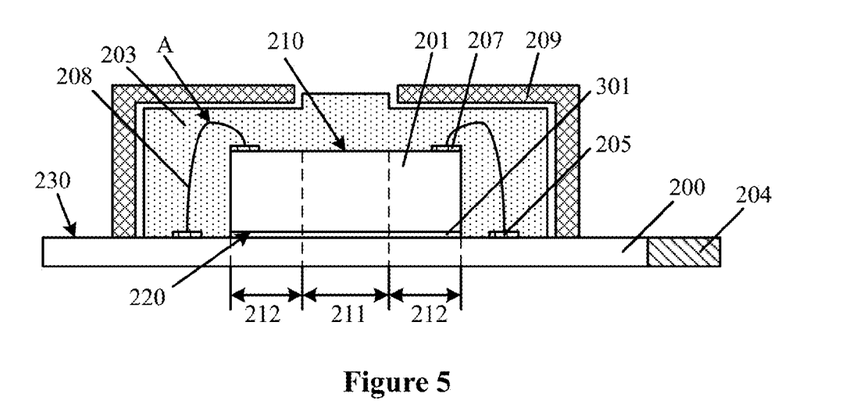
FIG. 5 is a schematic diagram of a packaging structure for a fingerprint identification chip according to a preferred embodiment of the disclosure.

In one embodiment, referring to FIG. 5, the packaging structure further includes a groove arranged in the plastic encapsulation layer 203 around the sensing area 211, where the groove is exposed from a side wall of the plastic encapsulation layer 203, and part of the protecting ring 209 arranged on the surface of the plastic encapsulation layer 203 is arranged in the groove. A surface of a top of the protecting ring 209 and the surface of the plastic encapsulation layer 203 are flat, which is beneficial to narrow a size of the packaging structure. And the plastic encapsulation layer 203 out of the sensing area 211 needs to be etched to form the groove, so it is only need to ensure that the surface of the plastic encapsulation layer 203 arranged on the surface of the sensing area 211 is flat, and a craftwork for forming the plastic encapsulation layer 203 is easy to be controlled accurately, and the thickness of the plastic encapsulation layer 203 on the surface of the sensing area 211 is easy to be controlled accurately.

Figure 6:
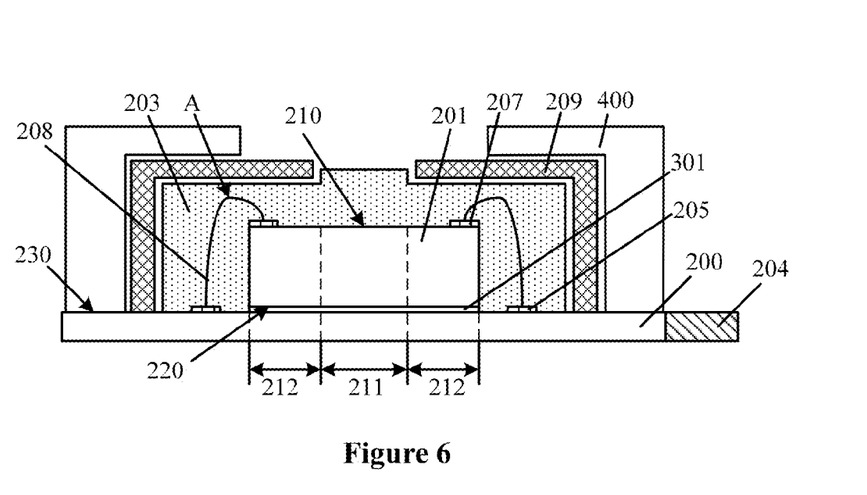
FIG. 6 is a schematic diagram of a packaging structure for a fingerprint identification chip according to a preferred embodiment of the disclosure.

In one embodiment, referring to FIG. 6, the packaging structure further includes a housing 400 surrounding the plastic encapsulation layer 203, the wire 208, the sensing chip 201 and the protecting ring 209. The plastic encapsulation layer 203 on a surface of the sensing area 211 is at least exposed from the housing 400, and a color of the plastic encapsulation layer 203 is the same as a color of the housing 400.

Figure 7:
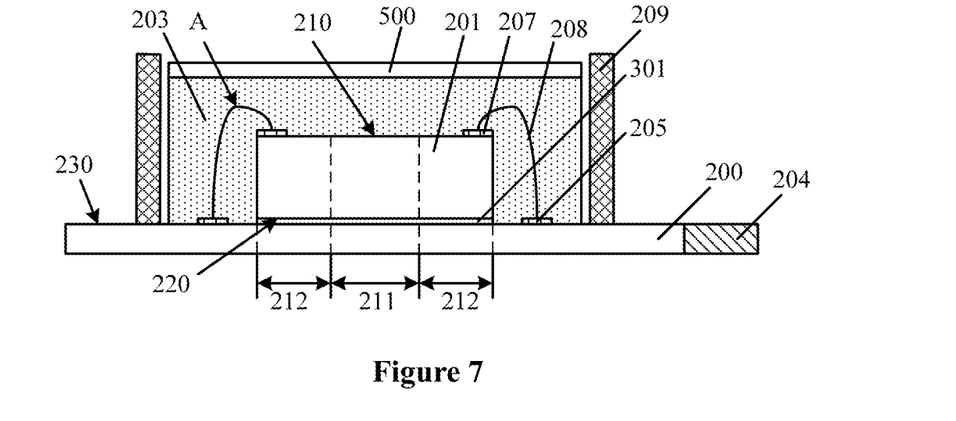
FIG. 7 is a schematic diagram of a packaging structure for a fingerprint identification chip according to a preferred embodiment of the disclosure.

In one embodiment, referring to FIG. 7, the packaging structure further includes a glass plate 500 arranged on the surface of the plastic encapsulation layer 203, where the glass plate 500 at least covers the sensing area 211 of the sensing chip 201. In the embodiment, there is a protecting ring 209 surrounding the plastic encapsulation layer 203, the sensing chip 201 and the wire 208. The surface of the plastic encapsulation layer 203 is exposed from the protecting ring 209. The glass plate 500 is arranged on the surface of the plastic encapsulation layer 203, and the packaging structure is more aesthetic.

The glass plate 500 is further used to protect the sensing area 211 of the sensing chip 201 and protect the plastic encapsulation layer 203 on the surface of the sensing area 203 to prevent the plastic encapsulation layer 203 from wearing down. In the embodiment, since the plastic encapsulation layer 203 already covers the surface of the sensing area 211, the glass plate 500 does not need to play a role of protecting the sensing area 211. The glass plate 500 is thin, as long as the glass plate 500 can protect the plastic encapsulation layer 203 from wearing down. Therefore, a sensing ability of the sensing chip 201 is still improved and a requirement of a high sensitivity of the sensing chip 201 is lowered.

In the embodiment, the second surface of the sensing chip is arranged on the substrate surface, the first surface of the sensing chip has the sensing area configured to extract a user fingerprint. The plastic encapsulation layer arranged on the substrate surface and the first surface of the sensing chip covers a surface of the sensing area of the sensing chip, the plastic encapsulation layer is configured to protect the sensing area. When a finger of a user is placed on the surface of the plastic encapsulation layer on the sensing area, the user fingerprint may be extracted in the sensing area. The sensing chip may convert the user fingerprint to an electrical signal to output. Since the plastic encapsulation layer is made of the polymer, the polymer has a good ductility and flexibility and a good covering function, the plastic encapsulation layer is thin and hardness of the plastic encapsulation layer is high, the plastic encapsulation layer has enough hardness to protect the sensing chip. Moreover, a distance from the surface of the plastic encapsulation layer to the sensing chip is reduced, the sensing chip can easily detect the user fingerprint. Accordingly, the packaging structure may reduce a requirement of a sensitivity of the sensing chip, which leads to a wide application of the packaging structure for the fingerprint identification chip.

Correspondingly, the embodiment of the disclosure further provides a packaging method for forming the above packaging structure for the fingerprint identification chip, as shown in FIG. 8 to FIG. 11.

Figure 8:
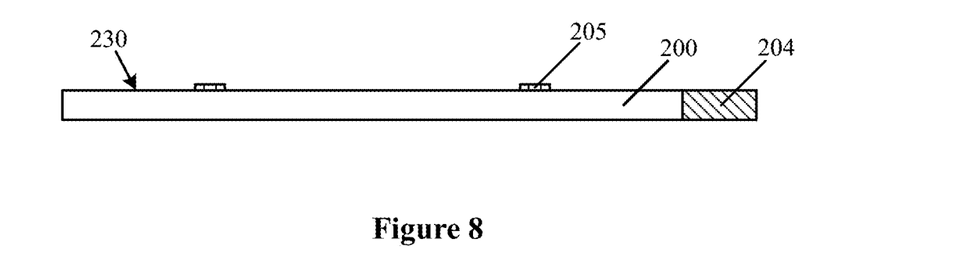
FIG. 8 to FIG. 11 each is a schematic section structural diagram of a packaging structure for the fingerprint identification chip in a packaging process according to an embodiment of the disclosure.

Referring to FIG. 8, the substrate 200 is provided. The substrate 200 has a substrate surface 230. The substrate surface 230 of the substrate 200 is provided with a first solder pad layer 205.

The substrate surface 230 of the substrate 200 is used to couple a subsequent sensing chip. A routing layer and the first solder pad layer 205 are formed on the substrate surface 230 of the substrate 200 and the routing layer is connected to the first solder pad layer 205. The first solder pad layer 205 is configured to be electrically connected to a subsequent sensing chip fixed on the substrate surface 230 of the substrate 200.

In the embodiment, a connecting part 204 is formed at one end of the substrate 200. The connecting part 204 may be made of conductive material. The routing layer is connected to the connecting part 204, the routing layer and the first solder pad layer 205 may be electrically connected to an outside circuit or component.

Figure 9:
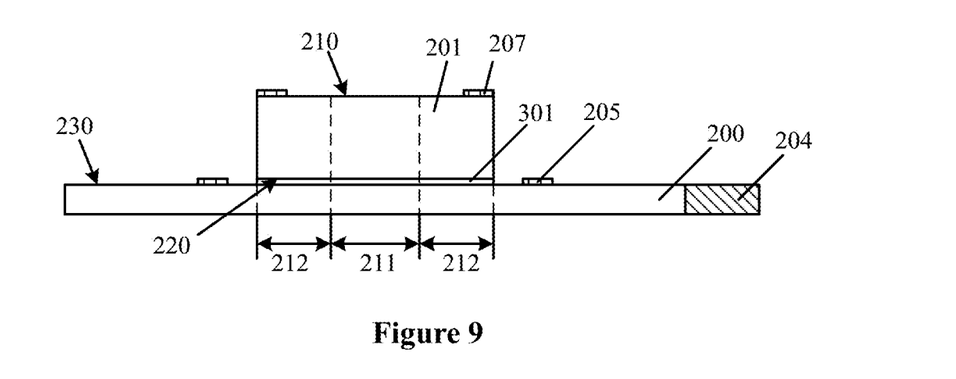

Referring to FIG. 9, the sensing chip 201 is fixed on the substrate surface 230 of the substrate 200. The sensing chip 201 has a first surface 210 and second surface 220 arranged opposite to the first surface 210. The second surface 212 of the sensing chip 201 is arranged on the substrate surface 230 of the substrate 200. The first surface 210 of the sensing chip 201 includes a sensing area 211 and a peripheral area 212 surrounding the sensing area 211. A surface of the sensing chip 201 in the peripheral area 212 is provided with a second solder pad layer 207 and the number of the second solder pad layer 207 is the same as the number of the first solder pad layers 205, a position of the second solder pad layer 207 has a one-to-one correspondence with a position of the first solder pad layer 205.

The sensing chip 201 is fixed on the substrate surface 230 of the substrate 200 via an adhesive layer. Subsequently, the second solder pad layer 207 is connected to the first solder pad layer 205 via the wire. Since, subsequently the second solder pad layer 207 is connected to the first solder pad layer 205 via the wire, there is no need to change a structure of the sensing chip 201 by an extra craftwork to suit a wiring between the second solder pad layer 207 and the first solder pad layer 205. The first surface 210 and the second surface 220 of the sensing chip 201 are all flat. Thus, a packaging craftwork in the embodiment is simplified and a manufacture cost of the packaging structure is lowered.

The sensing chip 201 is configured to identify a user fingerprint. The sensing area 211 of the sensing chip 201 is configured to sense fingerprint information of the user. The sensing area 211 has a capacitive structure or an inductive structure inside to detect and obtain the user fingerprint information and convert the user fingerprint information to an electrical signal to output.

In the embodiment, at least one capacitive plate is formed in the sensing area 211. When the user finger is placed on the surface of the plastic encapsulation layer 203 on the sensing area 211, the capacitive plate, the plastic encapsulation layer 203 and the user finger form a capacitive structure. The sensing area 211 may obtain a capacitance difference between a capacitance between the ridge on a surface of the user finger and the capacitive plate and a capacitance between the valley on a surface of the user finger and the capacitive plate, and output the capacitance difference after the capacitance difference is processed by the chip circuit, in this way, data of user fingerprint is obtained.

Figure 10:
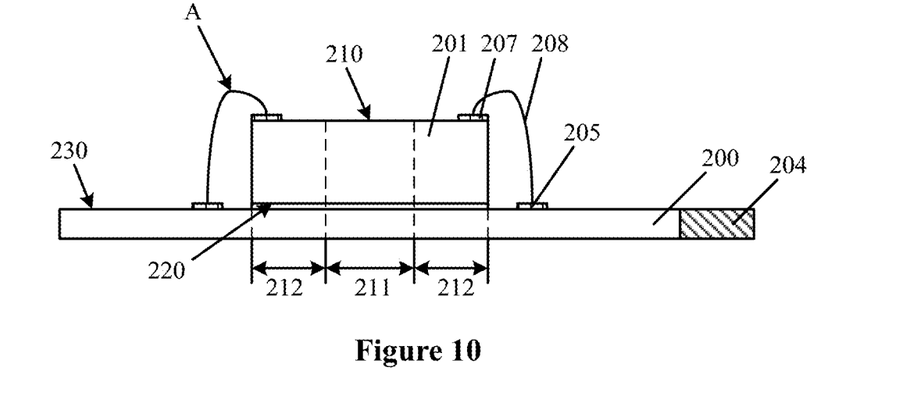

Referring to FIG. 10, a wire 208 is formed. Two ends of the wire 208 are electrically connected to the first solder pad layer 205 and the second solder pad layer 207 respectively. A point of the wire 208 which is the farthest away from the substrate surface 230 of the substrate 200 is a vertex A. A distance from the vertex to the first surface 210 of the sensing chip 201 is a first distance.

A craftwork for forming the wire 208 is a wire bonding craftwork. The wire 208 is made of metal. The metal includes copper, tungsten, aluminum, silver or gold. The wire 208 curves and the wire 208 has the vertex A which is the farthest away from the substrate surface 230 of the substrate 200. The first distance from the vertex A to the first surface 210 of the sensing chip 201 ranges from 50 micron to 80 micron. A distance subsequently formed from the surface of the plastic encapsulation layer to the surface of the sensing chip 201 needs to be greater than the first distance to ensure that the plastic encapsulation layer 203 may completely surround the wire 208 and the sensing chip 201.

Figure 11:
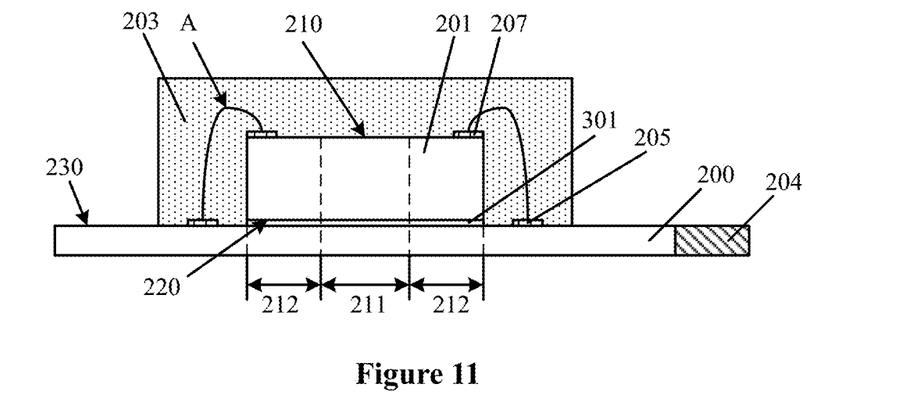

Referring to FIG. 11, the plastic encapsulation layer 203 is formed on the substrate surface 230 of the substrate 200 and the first surface 210 of the sensing chip 210. The plastic encapsulation layer 203 is made of the polymer. The plastic encapsulation layer 203 surrounds the wire 208 and the sensing chip 201. The surface of the plastic encapsulation layer 203 on the sensing area 211 is flat. There is the second distance from the surface of the plastic encapsulation layer 203 to the first surface 210 of the sensing chip 201. The second distance is greater than the first distance. The plastic encapsulation layer 203 completely surrounds the wire 208 and the sensing chip 201.

The plastic encapsulation layer 203 is made of an epoxy resin, a polyimide resin, a benzocyclobutene resin, polybenzoxazole resin, polybutylene terephthalate, a polycarbonate, polyethylene glycol terephthalate, polyethylene, polypropylene, a polyolefin, polyurethane, a polyolefin, a polyethersulfone, a polyamide, a polyurethane, an ethylene vinyl acetate copolymer, a polyvinyl alcohol or other suitable polymer.

A craftwork for forming the plastic encapsulation layer 203 is an injection molding craftwork, a transfer molding craftwork or a silkscreen craftwork. The plastic encapsulation layer may also be formed by adopting other suitable craftwork. The plastic encapsulation layer 203 is formed on the surface of the substrate 200, the plastic encapsulation layer 203 surrounds the sensing chip 201 and the wire 208 and covers the surface of the sensing area 211. The plastic encapsulation layer 203 is not only used to fix the sensing chip on the substrate surface of the substrate 200, protect and isolate the sensing chip 201 from the wire 208, but also used to protect the sensing area 211. The user finger may directly contact the plastic encapsulation layer 203 on the surface of the sensing area 211. The craftwork for forming the packaging structure for a fingerprint identification chip in the embodiment is simple, which may reduce a time of the craftwork and the manufacture cost.

The thickness of the plastic encapsulation layer 203 on the surface of the sensing area 211 ranges from 100 micron to 150 micron. The thickness is thin. When the user finger is placed on the surface of the plastic encapsulation layer 203 on the sensing area 211, the distance from the finger to the sensing area 211 is small, so the sensing area 211 can easily detect the fingerprint of the user finger and the requirement of the high sensitivity of the sensing chip 201 is lowered. In addition, the thickness is greater than the first distance from the vertex A of the wire 208 to the first surface 210 of the sensing chip 201, the plastic encapsulation layer 203 may completely surround the wire 208.

The Mohs hardness of the plastic encapsulation layer 203 is greater than or equal to 8 H. The hardness of the plastic encapsulation layer 203 is high. Even though the plastic encapsulation layer 203 on the surface of the sensing area 211 is thin, the plastic encapsulation layer 203 still can protect the sensing area 211 of the sensing chip 201. When the user finger moves on the surface of the plastic encapsulation layer 203 on the sensing area 211, the sensing chip 201 may not be damaged. The dielectric constant of the plastic encapsulation layer 203 is greater than or equal to 7. The electrical isolation ability of the plastic encapsulation layer 203 is strong. The protection ability of the plastic encapsulation layer 203 on the surface of the sensing area 211 for the sensing area 211 is strong.

In one embodiment, after the plastic encapsulation layer 203 is generated, a protecting ring is further formed on the surface of the substrate 200. The protecting ring surrounds the sensing chip 201, the wire 208 and the plastic encapsulation layer 203. The protecting ring is made of metal. The metal is copper, tungsten, aluminum, silver or gold. The protecting ring is connected to the ground via the substrate 200, so to conduct out an electrostatic charge of the surface of the plastic encapsulation layer 203.

In another embodiment, after the plastic encapsulation layer 203 is formed, a groove is formed in the plastic encapsulation layer 203 around the sensing area 211. The groove is exposed from a side wall of the plastic encapsulation layer 203. A protecting ring is formed on the surface of the substrate 200 around the plastic encapsulation layer 203, the wire 208 and the sensing chip 201. Part of the protecting ring is arranged on the surface of the plastic encapsulation layer 203, the plastic encapsulation layer 203 on the surface of the sensing area 211 of the sensing chip 201 is exposed from the protecting ring. The part of the protecting ring on the surface of the plastic encapsulation layer 203 is arranged in the groove.

In the embodiment, the first surface of the sensing chip has the sensing area. The plastic encapsulation layer formed on the substrate and the surface of the sensing chip further covers the surface of the sensing area. The plastic encapsulation layer may package the sensing chip and protect the sensing area of the sensing chip. When the user finger is placed on the surface of the plastic encapsulation layer on the sensing area, the fingerprint may be detected. Since the plastic encapsulation layer is made of the polymer, the polymer has a good ductility and flexibility and a good covering function, the plastic encapsulation layer on the surface of the sensing area is thin and hardness of the plastic encapsulation layer is high, the plastic encapsulation layer has enough hardness to protect the sensing chip. In addition, a distance from the surface of the plastic encapsulation layer to the sensing chip is reduced, the user fingerprint data may be easily detected in the sensing area. The formed packaging structure may reduce a requirement of a sensitivity of the sensing chip. An application field of the packaging method is wide. In addition, since the plastic encapsulation layer may package the sensing chip and protect the sensing area, and the method for packaging the sensing chip is simplified. The plastic encapsulation layer is made of the polymer, a cost for forming the plastic encapsulation layer is low, which reduces the cost of the packaging craftwork.

Although the disclosure is disclosed as the above description, the disclosure is not limited to the above description. Those skilled in the art may change and amend the disclosure without departing from the spirit and scope of the present disclosure. The protection scope of the present disclosure should be the scope limited by the claims.

The invention claimed is:

1. A packaging structure for a fingerprint identification chip, comprising:
   a substrate, wherein the substrate has a substrate surface, and the substrate surface is provided with a first solder pad layer;
   a sensing chip arranged on the substrate surface, wherein the sensing chip has a first surface and a second surface arranged opposite to the first surface, the second surface of the sensing chip is arranged on the substrate surface, the first surface of the sensing chip comprises a sensing area and a peripheral area surrounding the sensing area, and the surface of the sensing chip in the peripheral area is provided with a second solder pad layer;
   a wire, wherein two ends of the wire are electrically connected to the first solder pad layer and the second solder pad layer respectively, a point of the wire farthest away from the substrate surface is a vertex, and a distance from the vertex to the first surface of the sensing chip is a first distance;
   a plastic encapsulation layer arranged on the substrate surface and the first surface of the sensing chip, wherein the plastic encapsulation layer is made of a polymer, the plastic encapsulation layer surrounds the wire and the sensing chip, a surface of the plastic encapsulation layer on the sensing area is flat, a distance from the surface of the plastic encapsulation layer to the first surface of the sensing chip is a second distance, and the second distance is greater than the first distance;
   a protecting ring arranged on the substrate surface and the surface of the plastic encapsulation layer, wherein the protecting ring surrounds the sensing chip, the wire and the plastic encapsulation layer, and the plastic encapsulation layer on a surface of the sensing area of the sensing chip is at least exposed from the protecting ring; and
   a groove arranged in the plastic encapsulation layer around the sensing area, wherein the groove is exposed from a side wall of the plastic encapsulation layer, and part of the protecting ring is arranged in the groove.

2. The packaging structure for a fingerprint identification chip according to claim 1, wherein the first distance ranges from 50 micron to 80 micron, and the second distance ranges from 100 micron to 150 micron.

3. The packaging structure for a fingerprint identification chip according to claim 1, wherein a Mohs hardness of the plastic encapsulation layer is greater than or equal to 8H.

4. The packaging structure for a fingerprint identification chip according to claim 1, wherein a dielectric constant of the plastic encapsulation layer ranges from 7 to 9.

5. The packaging structure for a fingerprint identification chip according to claim 1, wherein the plastic encapsulation layer is made of an epoxy resin, a polyimide resin, a benzocyclobutene resin, polybenzoxazole resin, polybutylene terephthalate, a polycarbonate, polyethylene glycol terephthalate, polyethylene, polypropylene, a polyolefin, polyurethane, a polyolefin, a polyethersulfone, a polyamide, a polyurethane, an ethylene vinyl acetate copolymer or a polyvinyl alcohol.

6. The packaging structure for a fingerprint identification chip according to claim 1, wherein a bottom of the protecting ring is fixed on the substrate surface, and the protecting ring is connected to a ground via the substrate.

7. The packaging structure for a fingerprint identification chip according to claim 1, wherein the protecting ring is made of metal.

8. The packaging structure for a fingerprint identification chip according to claim 1, further comprising a housing surrounding the plastic encapsulation layer, the wire, the sensing chip and the protecting ring, wherein the plastic encapsulation layer on a surface of the sensing area is at least exposed from the housing, and a color of the plastic encapsulation layer is the same as a color of the housing.

9. The packaging structure for a fingerprint identification chip according to claim 1, further comprising an adhesive layer arranged between the sensing chip and the substrate, wherein the adhesive layer is configured to fix the sensing chip on the substrate surface.

10. The packaging structure for a fingerprint identification chip according to claim 1, further comprising a glass plate arranged on the surface of the plastic encapsulation layer, wherein the glass plate at least covers the sensing area of the sensing chip.

11. The packaging structure for a fingerprint identification chip according to claim 1, further comprising a housing surrounding the plastic encapsulation layer, the wire and the sensing chip, wherein the plastic encapsulation layer on a surface of the sensing area is exposed from the housing, and a color of the plastic encapsulation layer is the same as a color of the housing.

12. The packaging structure for a fingerprint identification chip according to claim 1, further comprising a connecting part arranged at an end of the substrate, wherein the connecting part is configured to electrically connect the sensing chip with an outside circuit.

13. The packaging structure for a fingerprint identification chip according to claim 1, wherein the substrate is a hard substrate or a soft substrate.

14. A packaging method for forming a packaging structure for a fingerprint identification chip, wherein the packaging structure comprises a substrate, a sensing chip, a wire and a plastic encapsulation layer, and the packaging method comprises:

providing the substrate, wherein the substrate has a substrate surface, and the substrate surface is provided with a first solder pad layer;

fixing the sensing chip on the substrate surface, wherein the sensing chip has a first surface and a second surface arranged opposite to the first surface, the second surface of the sensing chip is arranged on the substrate surface, the first surface of the sensing chip comprises a sensing area and a peripheral area surrounding the sensing area, and the surface of the sensing chip in the peripheral area is provided with a second solder pad layer, the number of the first solder pad layers is the same as the number of the second solder pad layers, a position of the first solder pad layer has a one-to-one correspondence with a position of the second solder pad layer;

forming the wire, wherein two ends of the wire are electrically connected to the first solder pad layer and the second solder pad layer respectively, a point of the wire farthest away from the substrate surface is a vertex, and a distance from the vertex to the first surface of the sensing chip is a first distance;

forming the plastic encapsulation layer on the substrate surface and the first surface of the sensing chip, wherein the plastic encapsulation layer is made of a polymer, the plastic encapsulation layer surrounds the wire and the sensing chip, a surface of the plastic encapsulation layer on the sensing area is flat, a distance from the surface of the plastic encapsulation layer to the first surface of the sensing chip is a second distance, and the second distance is greater than the first distance;

forming a groove in the plastic encapsulation layer around the sensing area, wherein the groove is exposed from a side wall of the plastic encapsulation layer; and forming a protecting ring on the substrate surface around the plastic encapsulation layer, the wire and the sensing chip, wherein part of the protecting ring is arranged on a surface of the plastic encapsulation layer, the plastic encapsulation layer on a surface of the sensing area of the sensing chip is at least exposed from the protecting ring, and the part of the protecting ring arranged on the surface of the plastic encapsulation layer is arranged in the groove.

15. The packaging method for a fingerprint identification chip according to claim 14, wherein a craftwork for forming the plastic encapsulation layer is an injection molding craftwork, a transfer molding craftwork or a silkscreen craftwork.

* * * * *

UNITED STATES PATENT AND TRADEMARK OFFICE
CERTIFICATE OF CORRECTION

PATENT NO. : 10,096,643 B2  
APPLICATION NO. : 15/321705  
DATED : October 9, 2018  
INVENTOR(S) : Zhiqi Wang et al.

Page 1 of 1

It is certified that error appears in the above-identified patent and that said Letters Patent is hereby corrected as shown below:

On the Title Page

Item (71) "China Wafer Level CSP Co., Ltd., Suzhou (CN)" should be -- China Wafer Level CSP Co., Ltd., Suzhou, Jiangsu (CN) --

Signed and Sealed this
Fifteenth Day of January, 2019

Andrei Iancu
*Director of the United States Patent and Trademark Office*